United States Patent
Kudo et al.

(10) Patent No.: US 9,904,246 B2
(45) Date of Patent: Feb. 27, 2018

(54) BLOWING TUBE, BLOWING DEVICE, AND IMAGE FORMING APPARATUS

(71) Applicant: FUJI XEROX CO., LTD., Tokyo (JP)

(72) Inventors: Masafumi Kudo, Ashigarakami-gun (JP); Yasunori Momomura, Yokohama (JP); Yuki Nagamori, Ebina (JP)

(73) Assignee: FUJI XEROX CO., LTD., Tokyo (JP)

( * ) Notice: Subject to any disclaimer, the term of this patent is extended or adjusted under 35 U.S.C. 154(b) by 0 days.

(21) Appl. No.: 15/240,514

(22) Filed: Aug. 18, 2016

(65) Prior Publication Data
US 2017/0242397 A1  Aug. 24, 2017

(30) Foreign Application Priority Data
Feb. 22, 2016  (JP) .................. 2016-030560

(51) Int. Cl.
*G03G 21/20* (2006.01)
*H05K 7/20* (2006.01)

(52) U.S. Cl.
CPC ....... *G03G 21/206* (2013.01); *H05K 7/20136* (2013.01)

(58) Field of Classification Search
CPC ............ G03G 21/206; G03G 15/2017; G03G 2221/1645; G03G 21/20; G03G 21/1619
See application file for complete search history.

(56) References Cited

U.S. PATENT DOCUMENTS

2012/0205070 A1* 8/2012 Kamiya .................. F24F 13/24
165/96

FOREIGN PATENT DOCUMENTS

JP   H10-20723 A    1/1998
JP   2014-203039 A  10/2014

OTHER PUBLICATIONS

Translation of Kudo (JP 2014203039 A) listed in the IDS, publication date: Oct. 27, 2014.*

* cited by examiner

*Primary Examiner* — Walter L Lindsay, Jr.
*Assistant Examiner* — Frederick Wenderoth
(74) *Attorney, Agent, or Firm* — Oliff PLC

(57) ABSTRACT

A blowing tube is provided and includes: a passage portion and plural restriction portions. The passage portion includes an inlet passage portion including a first passage space, a first bent passage portion including a second passage space, and a second bent passage portion including a third passage space. One of the restriction portions includes a plate-shaped blocking portion and an air passage portion disposed between one end of the blocking portion and an inner wall surface on an inner side of the second passage space of the first bent passage portion in the bent direction of the second bent passage portion. A bar-shaped member is provided in the third passage space and present in an isolated manner along a longitudinal direction of an opening of the air passage portion of the restriction portion. The air flowing out through the air passage portion collides against the bar-shaped member and diverges.

11 Claims, 18 Drawing Sheets

BLOWING TUBE, BLOWING DEVICE, AND IMAGE FORMING APPARATUS

CROSS-REFERENCE TO RELATED APPLICATIONS

This application is based on and claims priority under 35 USC 119 from Japanese Patent Application No. 2016-030560 filed Feb. 22, 2016.

BACKGROUND

Technical Field

The present invention relates to a blowing tube, a blowing device, and an image forming apparatus.

SUMMARY

According to an aspect of an exemplary embodiment of the invention, a blowing tube includes a passage portion and plural restriction portions. The passage portion includes a passage space that connects an inlet port taking in air and an outlet port through which the air taken in from the inlet port is discharged. The outlet port has an opening which is longer in one direction. The air flows through the passage space. The restriction portions are provided at different portions of the passage space of the passage portion in an airflow direction and restrict a flow of the air. The passage portion includes an inlet passage portion, a first bent passage portion, and a second bent passage portion. The inlet passage portion includes a first passage space having a shape in which the inlet port is present at one end thereof. The first bent passage portion includes a second passage space having a shape that is bent at an intermediate portion of the inlet passage portion and extends. The second bent passage portion includes a third passage space having a shape that has a bent portion that is bent from an end of the first bent passage portion in one direction, the outlet port being disposed at an end of the second bent passage extending from the bent portion. One of the restriction portions is a first restriction portion including a plate-shaped blocking portion and an air passage portion. The plate-shaped blocking portion is disposed across a portion of the second passage space of the first bent passage portion so as to block a flow of the air. The air passage portion is disposed between one end of the blocking portion and an inner wall surface that is disposed on an inner side of the second passage space of the first bent passage portion in a bent direction of the second bent passage portion. The air passage portion has a rectangular opening through which the air passes. A bar-shaped member is provided in the third passage space of the second bent passage portion such that the bar-shaped member is present in an isolated manner along a longitudinal direction of an opening of the air passage portion of the first restriction portion, and the air flowing out through the air passage portion collides against the bar-shaped member and diverges.

BRIEF DESCRIPTION OF THE DRAWINGS

Exemplary embodiments of the present invention will be described in detail based on the following figures, wherein.

DETAILED DESCRIPTION

Hereinafter, exemplary embodiments of the invention will be described with reference to the accompanying drawings.

Exemplary Embodiment 1

Figure 1:
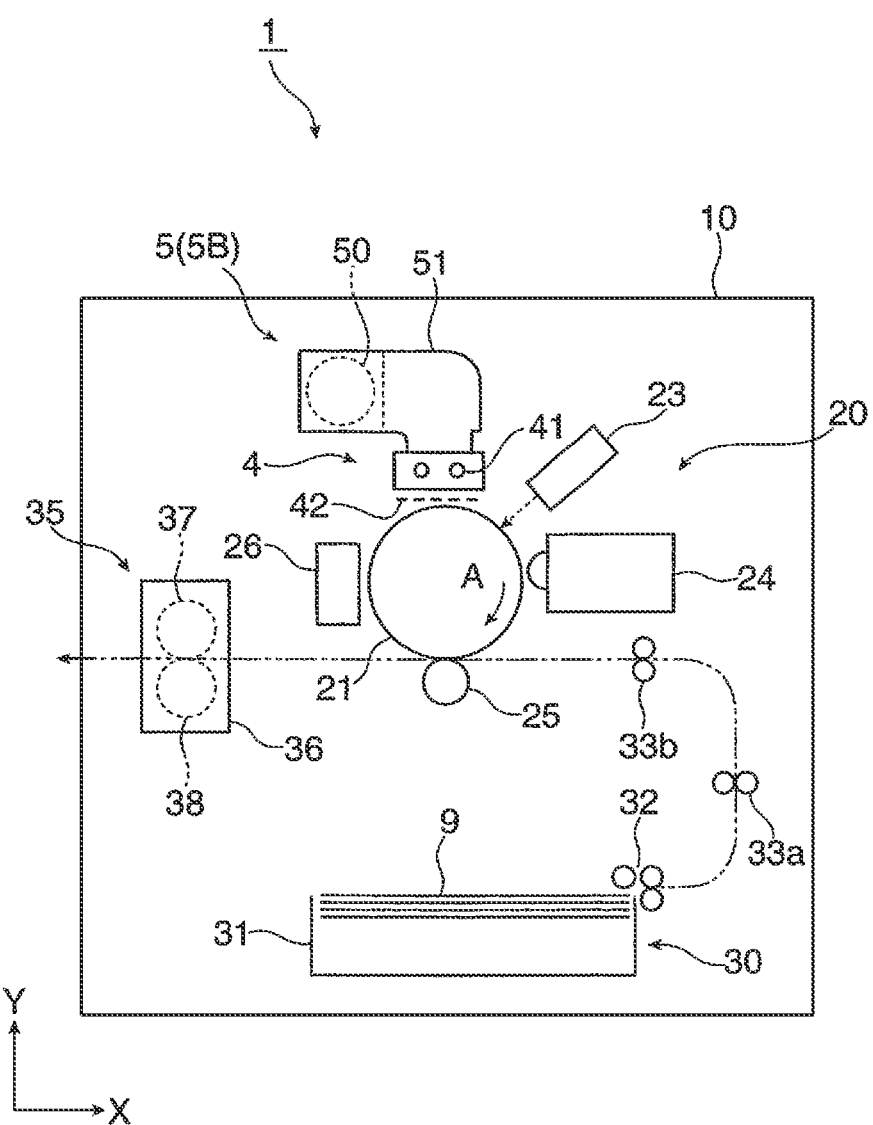
FIG. 1 is a view illustrating an outline of an image forming apparatus including a blowing device in Exemplary Embodiment 1.
Figure 2:
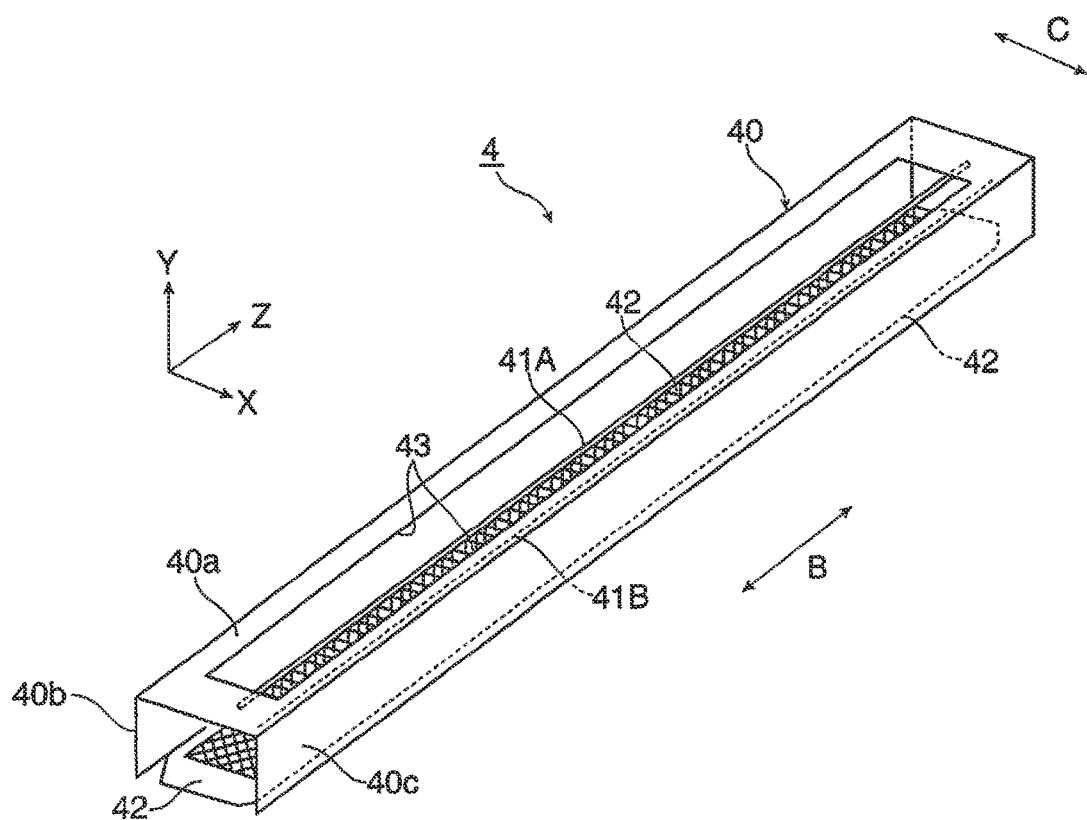
FIG. 2 is a perspective view illustrating an outline of a charging device of the image forming apparatus in FIG. 1.
Figure 3:
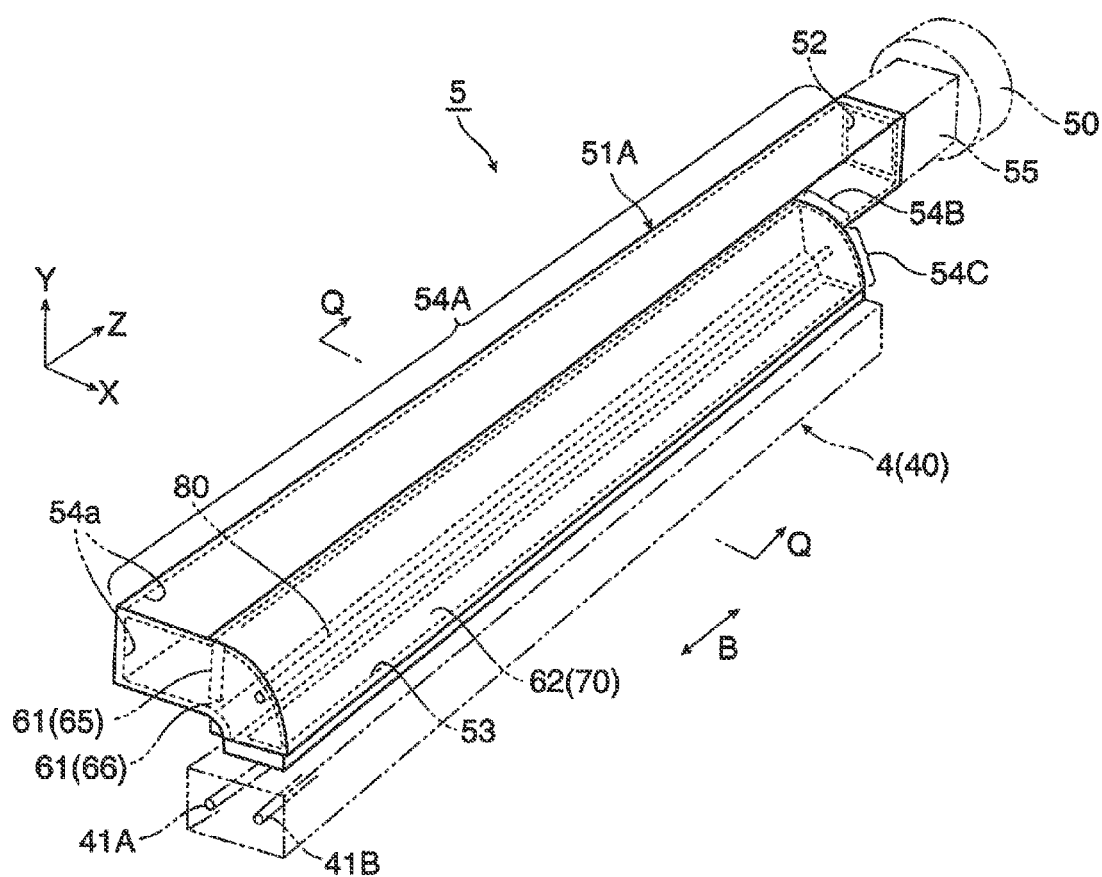
FIG. 3 is a perspective view illustrating an outline of the blowing device which is applied to the charging device in FIG. 2.
Figure 4:
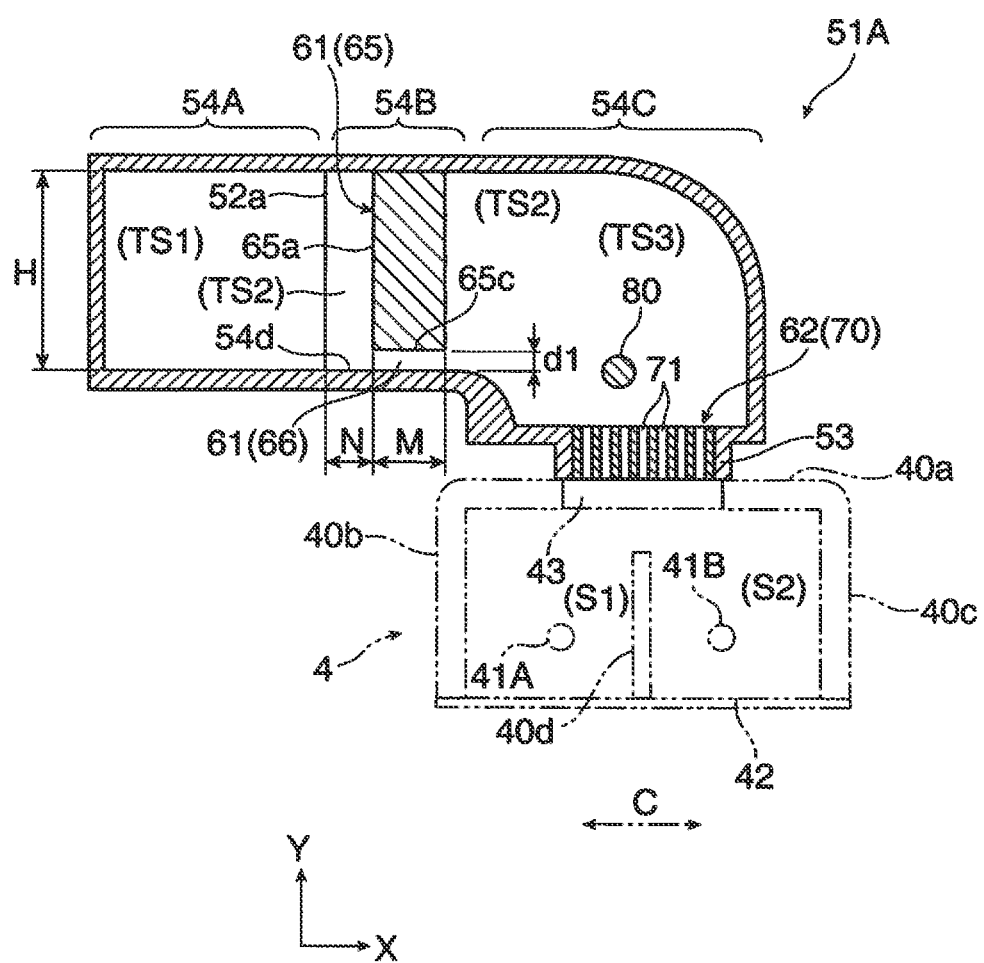
FIG. 4 is a sectional view of the blowing device (mainly a blowing tube) taken along line IV-IV in FIG. 3.

FIGS. 1 to 4 illustrate a blowing duct as an example of a blowing tube, a blowing device including the blowing duct, and an image forming apparatus of Exemplary Embodiment 1. FIG. 1 illustrates an outline of the image forming apparatus. FIG. 2 illustrates a charging device which is an example of a long target structure to which air has to blow from the blowing duct or the blowing apparatus. FIG. 3 illustrates an outline of the blowing duct or the blowing apparatus. FIG. 4 illustrates the inner structure of the blowing duct and the like.

Configuration of Image Forming Apparatus

As illustrated in FIG. 1, an image forming apparatus 1 includes the following components disposed in an internal space of a housing 10 including a support frame, an exterior cover, and the like: an image forming unit 20 that forms a toner image formed of a toner which is a developer, and transfers the toner image onto a recording sheet 9 which is an example of a recording material; a sheet feeding device 30 that contains and transports the recording sheet 9 to the image forming unit 20; and a fixing device 35 that fixes the toner image, which is formed by the image forming unit 20, to the recording sheet 9; and the like.

The image forming unit 20 is configured as a well-known electrophotographic system. Specifically, the image forming unit 20 includes mainly a photoconductor drum 21 is driven to rotate in the direction of an arrow A; a charging device 4 that charges a circumferential surface (image forming region) of the photoconductor drum 21 to a desired potential; an exposure device 23 that forms an electrostatic latent image on the charged circumferential surface of the photoconductor drum 21 by irradiating light (illustrated by a dotted line with an arrowhead) based on image information (signals) input from an external device; a developing device 24 that develops the electrostatic latent image into a toner image with a toner; a transfer device 25 that transfers the toner image from the photoconductor drum 21 onto the recording sheet 9; and a cleaning device 26 that cleans the circumferential surface of the photoconductor drum 21 by removing undesired substances such as a toner residing on the circumferential surface after transfer.

A charging device configured as a corona discharger is used as the charging device 4. As illustrated in FIG. 2 and the like, the charging device 4 is configured as a so-called scorotron corona discharger.

That is, the charging device 4 includes a shielding case 40, two end portion supports (not illustrated), two corona discharge wires 41A and 41B, and a multi-hole grid electrode (electric field adjustment plate) 42. The shielding case 40 is an example of an enclosure member and has an exterior shape including a rectangular top plate 40a and side plates 40b and 40c descending from long side portions of the top plate 40a and extending along a longitudinal direction B. The end portion supports are attached to both end portions (short side portions) of the shielding case 40 in the longitudinal direction B. The corona discharge wires 41A and 41B are attached between the two end portion supports such that the two corona discharge wires 41A and 41B are present in an internal space of the shielding case 40 which is long in the longitudinal direction B and stretch across the internal space while being substantially parallel to each other. The multi-hole grid electrode 42 is attached to a discharge lower opening portion of the shielding case 40 while covering substantially the entire lower opening portion and being present between the corona discharge wires 41A and 41B and the circumferential surface of the photoconductor drum 21. Reference sign 40d illustrated in FIG. 4 and the like represents a partition wall plate that divides the internal space of the shielding case 40 into spaces (S1 and S2), in which the two corona discharge wires 41A and 41B are respectively disposed, along the longitudinal direction B. The lower opening portion is formed to have a rectangular opening shape.

The two corona discharge wires 41A and 41B of the charging device 4 are disposed at least such that the two corona discharge wires 41A and 41B face the circumferential surface of the photoconductor drum 21 while being spaced a predetermined gap (for example, discharge gap) therefrom, and face the image forming region of the photoconductor drum 21 along the direction of a rotational axis of the photoconductor drum 21. During the forming of an image, an electric power supply device (not illustrated) supplies a discharge voltage to each of the corona discharge wires 41A and 41B (between the photoconductor drum 21 and the corona discharge wires 41A and 41B) of the charging device 4.

Over the usage of the charging device 4, substances (undesired substances) such as paper dust of the recording sheet 9, discharge products by a corona discharge, and an external additive to the toner are attached to and contaminate the corona discharge wires 41A and 41B or the grid electrode 42. As a result, a corona discharge may be performed insufficiently or non-uniformly, and discharge defects such as a non-uniform discharge may occur. For this reason, a blowing device 5 is provided together with the charging device 4, and blows air toward the corona discharge wires 41A and 41B and the grid electrode 42 so as to prevent or restricting undesired substances from being attached to the corona discharge wires 41A and 41B and the grid electrode 42. An opening portion 43 is formed in the top plate 40a of the shielding case 40 of the charging device 4 so as to take in air delivered from the blowing device 5. The opening portion 43 is formed to have a rectangular opening shape. The blowing device 5 will be described in detail later.

The sheet feeding device 30 includes a sheet container 31 that contains multiple recording sheets 9 of a desired size and type which are stacked on top of each other and on which images are formed; and a delivery device 32 that delivers the recording sheets 9, which are contained in the sheet container 31, toward a transporting path one by one. Upon an arrival of a time to feed sheets, the sheet feeding device 30 delivers the recording sheets 9 one by one. Multiple sheet containers 31 are installed according to usage modes. In FIG. 1, an alternate one long and two short dashes line with an arrowhead represents a transporting path on which the recording sheet 9 is mainly transported and moved in the internal space of the housing 10. The transporting path of the recording sheet 9 includes multiple sheet transport roll pairs 33a and 33b, a transporting guide member (not illustrated), and the like.

The fixing device 35 includes a heating rotating body 37 and a pressing rotating body 38 in a housing 36 provided with a feed port and a discharge port through which the recording sheet 9 passes. The heating rotating body 37 has a roll shape or a belt shape. A surface temperature of the heating rotating body 37 is heated to and maintained at a desired temperature by a heating unit. The pressing rotating body 38 has a roll shape or a belt shape. The pressing rotating body 38 is in contact with the heating rotating body 37 at a desired pressure along substantially an axial direction of the heating rotating body 37, and is driven to rotate. In the fixing device 35, a contact portion, in which the heating rotating body 37 is in contact with the pressing rotating body 38 and which is formed therebetween, is configured as a fixing process unit that performs a desired fixing process (heating and pressing). Fixing is performed by feeding and passing the recording sheet 9, to which a toner image is transferred, to and through the contact portion.

An image is formed in the following manner by the image forming apparatus 1. Hereinafter, representatively, a basic image forming operation, in which an image is formed on a single surface of the recording sheet 9, will be described.

If the image forming apparatus 1 receives an instruction, which indicates a start of an image forming operation, from a control device (not illustrated), in the image forming unit 20, the circumferential surface of the photoconductor drum 21 starting to rotate is charged to a predetermined polarity and potential by the charging device 4. At this time, the charging device 4 supplies a charge voltage to each of the two corona discharge wires 41A and 41B, and generates a corona discharge which forms an electric field between the corona discharge wires 41A and 41B and the circumferential surface of the photoconductor drum 21. As a result, the circumferential surface of the photoconductor drum 21 is charged to a desired potential. At this time, the charged potential of the photoconductor drum 21 is adjusted by the grid electrode 42.

Subsequently, the exposure device 23 forms an electrostatic latent image having the desired potential by exposing light to the charged circumferential surface of the photoconductor drum 21 based on image information. Thereafter, when the photoconductor drum 21 on which the electrostatic latent image is formed passes through the developing device 24, the electrostatic latent image is developed by a toner which is supplied from a developing roll and is charged to a desired polarity, such that the electrostatic latent image is formed as a toner image.

Subsequently, if the toner image formed on the photoconductor drum 21 is transported to a transfer position facing the transfer device 25 by the rotation of the photoconductor drum 21, the toner image is transferred to the recording sheet 9, which is supplied from the sheet feeding device 30 via the transporting path, via a transfer operation performed by the transfer device 25. The circumferential surface of the photoconductor drum 21 after transfer is cleaned by the cleaning device 26.

Subsequently, after the recording sheet 9, to which the toner image is transferred in the image forming unit 20, is peeled off from the photoconductor drum 21, the recording sheet 9 is transported and fed to the fixing device 35. When passing through the contact portion between the heating rotating body 37 and the pressing rotating body 38 of the fixing device 35, the toner image is heated under pressure, and is melt and fixed to the recording sheet 9. The recording sheet 9 after the fixing is complete is discharged from the fixing device 35, and is transported to and contained in an output sheet container (not illustrated) or the like which is provided outside the housing 10.

A single color image formed of a single color toner is formed on one surface of one recording sheet 9, and the basic image forming operation is ended. If there is an instruction indicating the execution of multiple image forming operations, a series of the same aforementioned operations are repeated by the number of image forming operations.

Configuration of Blowing Device (Mainly Blowing Duct)

Hereinafter, the blowing device 5 will be described.

As illustrated in FIGS. 1 and 3 and the like, the blowing device 5 includes an air blower 50 including a rotating fan that delivers air, and a blowing duct 51A that takes in air delivered from the air blower 50, guides the air to the charging device 4 which is a target structure for the blowing of air, and discharges the air.

For example, a radial flow type blowing fan is used as the air blower 50. The operation of the air blower 50 is controlled such that the air blower 50 delivers a desired volume of air.

As illustrated in FIGS. 3 to 6 and the like, the blowing duct 51A includes a passage portion (body portion) 54 and two restriction portions 61 and 62. The passage portion 54 is formed such that a passage space TS that connects an inlet port 52 taking in air delivered from the air blower 50 and an outlet port 53 through which the air taken in by the inlet port 52 is discharged. The outlet port 53 has an opening which is long in one direction. The air flows through the passage space TS. The passage space TS is bent twice at intermediate positions therein. The restriction portions 61 and 62 are provided in different portions of the passage space TS of the passage portion 54 in an airflow direction. The restriction portions 61 and 62 restrict a flow of the air.

The inlet port 52 of the blowing duct 51A is formed to have a rectangular opening which is slightly horizontally long in its entirety. A connection duct 55 is attached to the inlet port 52 such that the inlet port 52 is connected to the air blower 50 via the connection duct 55, and air generated by the air blower 50 is delivered to the inlet port 52 via the connection duct 55.

Figure 6:
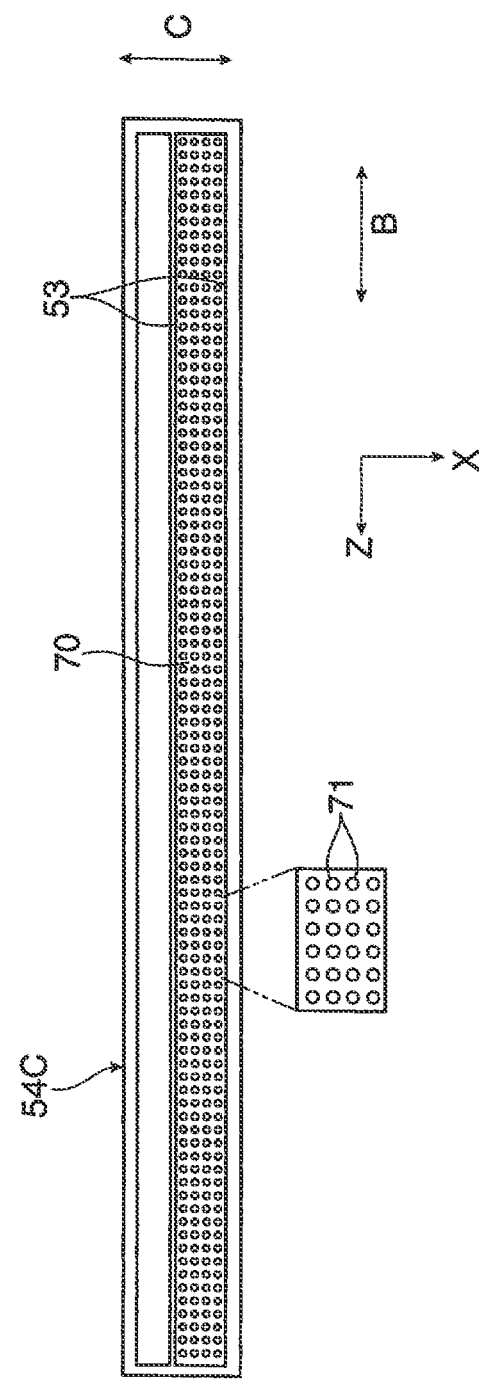
FIG. 6 is a schematic view of the blowing device in FIG. 3 which is viewed from the bottom (outlet port)
Figure 7:
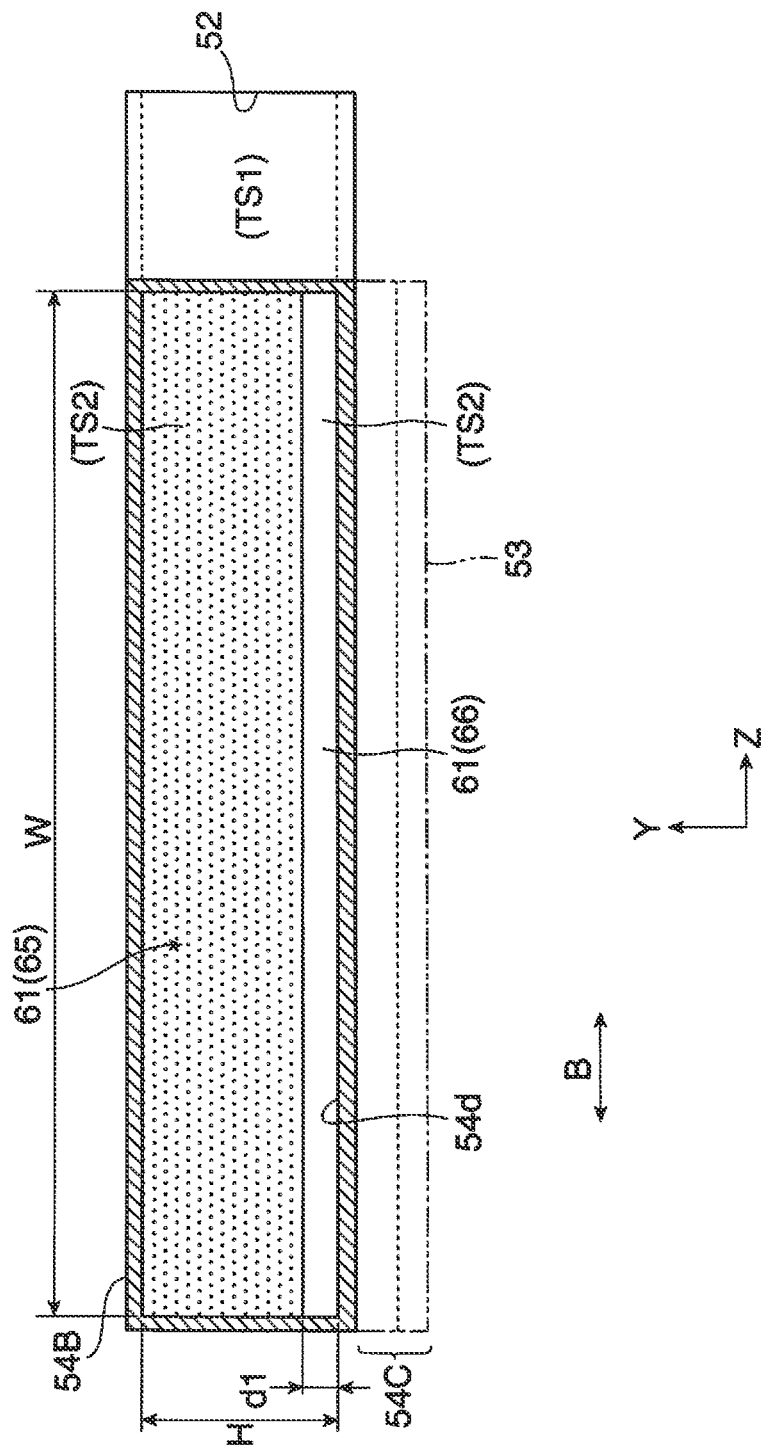
FIG. 7 is a partial sectional view illustrating a configuration of a first restriction portion of the blowing device in FIG. 3.

The outlet port 53 of the blowing duct 51A is formed to have a rectangular opening which is elongated in its entirety. The outlet port 53 is disposed to face a longitudinal portion (in this example, the opening portion 43 of the shielding case 40 which will be described later) of the charging device 4 (target for the blowing of air) which is long in one direction and to which air has to blow, while being substantially parallel to the longitudinal portion. As illustrated in FIGS. 4 and 6 and the like, the outlet port 53 is formed to have an opening area slightly smaller than the entire area of a trailing end portion of the passage portion 54 (second bent passage portion 54C) in which the outlet port 53 is present.

Figure 5:
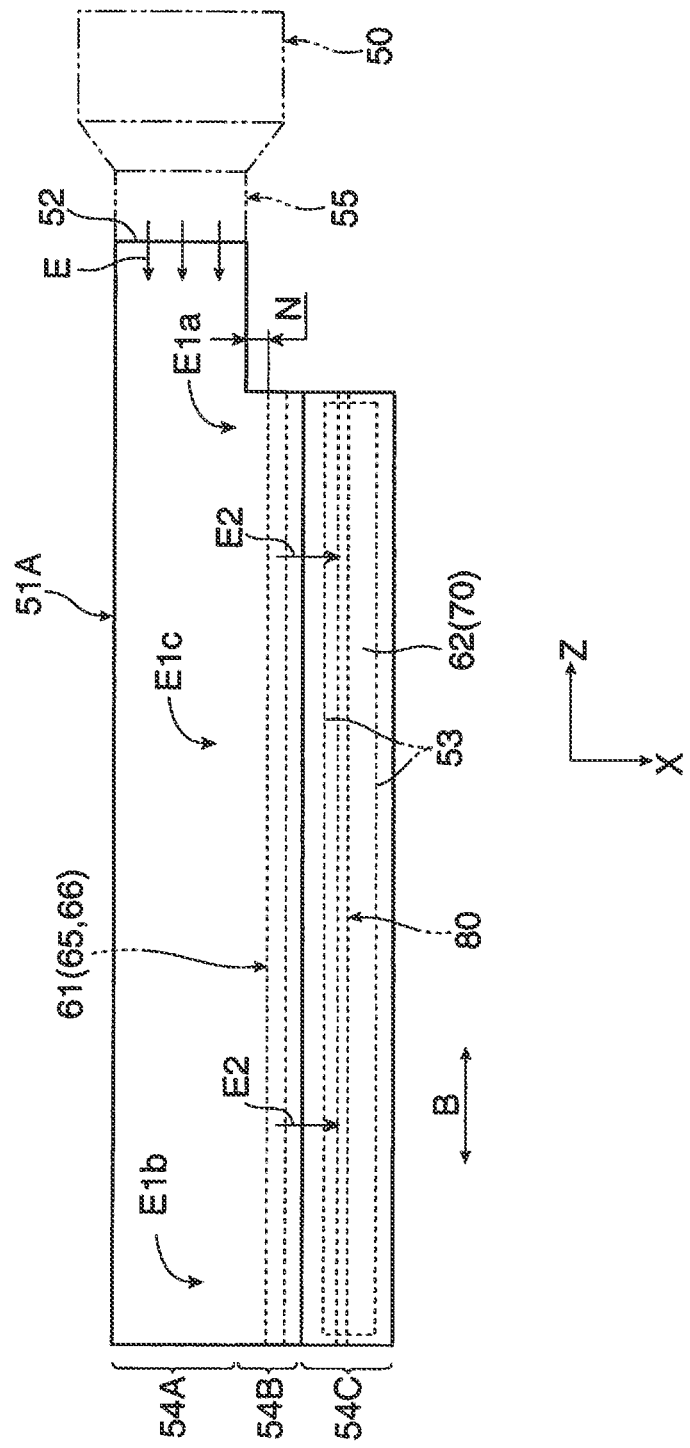
FIG. 5 is a schematic view of the blowing device in FIG. 3 which is viewed from above.

As illustrated in FIGS. 3 to 5 and the like, the passage portion 54 of the blowing duct 51A includes an inlet passage portion 54A; a first bent passage portion 54B; and the second bent passage portion 54C.

The inlet passage portion 54A is a passage portion that extends straight while being substantially parallel to the longitudinal direction B (the same as a longitudinal direction of the charging device 4) of the opening of the outlet port 53, and that includes a first passage space TS1 having a squared tubular shape which includes the inlet port 52 in one end portion in a longitudinal direction of the first passage space TS1. The inlet passage portion 54A includes the other end portion that is closed and opposite to the end portion in which the inlet port 52 is present.

The first bent passage portion 54B is a bent passage portion that extends from a portion (intermediate portion) of the inlet passage portion 54A that is closer to the other end portion while being bent at substantially the right angle toward substantially a horizontal direction (substantially parallel to a direction represented by a coordinate axis X in FIG. 4 and the like), and that includes a second passage space TS2 having a flat squared tubular shape. The first bent passage portion 54B is a passage portion, of which the entire cross-sectional passage area of the second passage space TS2 is extended and increased in the horizontal direction by setting the height of the second passage space TS2 to a height H of the first passage space TS1, and increasing the width (dimension in the longitudinal direction B) of the second passage space TS2 by W relative to the inlet passage portion 54A. The first bent passage portion 54B is a bent passage portion that is initially bent at a position closest to the inlet port 52 in the blowing duct 51A.

The second bent passage portion 54C is a bent passage portion which is bent downward from an end portion (positioned on the downstream side of the airflow direction) of the first bent passage portion 54B in a vertical direction (substantially parallel to a direction represented by a coordinate axis Y), and extends to approach the charging device 4 that is a target object for the blowing of air, and in which a third passage space TS3 is formed. The second bent passage portion 54C is a bent passage portion, of which the width (dimension in the longitudinal direction B) of the third passage space TS3 is the same as that of the second passage space TS2 of the first bent passage portion 54B, and which is bent downward from the second passage portion TS2. The outlet port 53 having the aforementioned configuration is provided in a trailing end portion of the second bent passage portion 54C.

The restriction portion 61 of the blowing duct 51A is provided as a first restriction portion 61 that includes a plate-shaped blocking portion 65 and an air passage portion 66. The plate-shaped blocking portion 65 is disposed across a portion of the second passage space TS2 of the first bent passage portion 54B so as to block a flow of the air. The air passage portion 66 is disposed between one end of the blocking portion 65 and an inner wall surface (bottom surface) 54d that is disposed on an inner side of the second passage space TS2 of the first bent passage portion 54B in a bent direction of the second bent passage portion 54C. The air passage portion 66 has a rectangular opening through which air passes.

The blocking portion 65 and the air passage portion 66 of the first restriction portion 61 are disposed in the second passage space TS2 while being substantially parallel to the longitudinal direction B of the opening of the outlet port 53. As illustrated in FIGS. 4 and 5 and the like, the plate-shaped blocking portion 65 is disposed such that a surface portion 65a of the plate-shaped blocking portion 65 positioned on the upstream side of the airflow direction is positioned while being offset by a desired distance N from a side end portion 52a (present close to the outlet port 53) of an opening portion of the inlet port 52 toward the downstream side of the second passage space TS2 of the first bent passage portion 54B in the airflow direction. In contrast, an opening of the air passage portion 66 has a height (dimension of a gap between a lower end 65c of the blocking portion 65 and the bottom surface 54d of the second passage space TS2) dl, a width (the same as that of the second passage space TS2) W, and a path length (dimension in the airflow direction and the same as the thickness of the blocking portion 65) M which are respectively set to desired dimensions.

The blocking portion 65 of the first restriction portion 61 may be integrally molded with the blowing duct 51A of the same material. Alternatively, the blocking portion 65 may be formed of a material different from that of the blowing duct 51A. In the first restriction portion 61, the disposition position (distance N) of the blocking portion 65, and the values of the height dl, the width W, and the path length M of the air passage portion 66 are selected and set such that the air speed of air flowing into the first bent passage portion 54B from the inlet passage portion 54A becomes uniform as much as possible. The values are set while taking into consideration the dimensions of the blowing duct 51A (the volume of the passage portion 54), the flow rate of air (the volume of air), which has to flow through the blowing duct 51A or the charging device 4 per unit time, or the like.

The restriction portion 62 of the blowing duct 51A is provided as a downstream-most restriction portion that is present at the end (outlet port 53) of the second bent passage portion 54C. The downstream-most restriction portion 62 is configured such that the outlet port 53 is blocked by an air passage member 70 including multiple air passage portions 71.

As illustrated in FIG. 6, each of the multiple air passage portions 71 is a through hole that is a substantially circular opening, extends straight, and passes through the permeable member 70. The multiple air passage portions 71 are arranged at equal intervals along the longitudinal direction B of the opening of the outlet port 53, and are arranged at the same equal intervals as the equal intervals in a lateral direction C perpendicular to the longitudinal direction B such that multiple lines (for example, 4 lines) of the air passage portions 71 are formed. As a result, the multiple air passage portions (holes) 71 are present in a substantially uniform dotted pattern in the entire region of the third passage space TS3 or the opening of the outlet port 53 at the end of the second bent passage portion 54C. For this reason, the permeable member 70 of Exemplary Embodiment 1 is formed into a multi-hole plate obtained by forming the multiple air passage portions (holes) 71 in a plate-shaped member in a uniform dotted pattern.

The permeable member 70 may be integrally molded with the blowing duct 51A of the same material. Alternatively, the permeable member 70 may be formed of a material different from that of the blowing duct 51A. The opening shape of the air passage portion (hole) 71, the values of the opening dimensions and the hole length of the air hole 71, and the value of the density of holes are selected and set such that the air speed of air, which flows out from the second bent passage portion 54C via the outlet port 53, becomes uniform as much as possible. The values are set while taking into consideration the dimensions of the blowing duct 51A (the volume of the passage portion 54), the flow rate of air which has to flow through the blowing duct 51A or the charging device 4 per unit time, or the like.

As illustrated in FIGS. 4 and 5, and the like, the blowing duct 51A is provided with a bar-shaped member 80 which is provided in an isolated manner in the third passage space TS3 of the second bent passage portion 54C along the longitudinal direction (B) of the opening of the air passage portion 66 of the first restriction portion 61. Air (E2) flowing out through the air passage portion 66 collides against the bar-shaped member 80 and diverges.

The bar-shaped member 80 is configured with a round bar having a predetermined diameter R and a circle shape in section. The bar-shaped member 80 is attached such that both end portions in a longitudinal direction of the bar-shaped member 80 are fixed to a side wall surface forming the third passage space TS3 of the second bent passage portion 54C.

The bar-shaped member 80 is disposed at a position at which at least a mainstream (relatively powerfully flowing airstream) of the air (E2) flowing out through the air passage portion 66 of the first restriction portion 61 is capable of colliding against the bar-shaped member 80, and diverging to a desired state. The desired state of flow divergence represents a state in which the volume of air (volume of an upper divergent flow) diverging from the bar-shaped member 80 and flowing on the upper side is substantially the same as the volume of air (volume of a lower divergent flow) diverging from the bar-shaped member 80 and flowing on the lower side, or a state in which the volume of the lower divergent flow is larger by a small percentage (for example, two percentages) than the volume of the upper divergent flow.

The diameter R of the bar-shaped member 80 having a circular shape in section may be set to a dimension which is equal to or greater than the same value as the height dl of the air passage portion 66 of the first restriction portion 61, and is equal to or less than a value three times the height dl. The bar-shaped member 80 is made of a material such as acrylonitrile-butadiene-styrene copolymer (ABS resin).

Operation of Blowing Device

Hereinafter, an operation (operation associated with mainly the blowing duct 51A) of the blowing device 5 will be described.

Upon an arrival of a drive set time such as an image forming operation, first, the blowing device 5 drives the rotation of the air blower 50, and delivers a desired volume of air. After air (E) delivered from the started air blower 50 is taken in by the inlet port 52 of the blowing duct 51A via the connection duct 55, the air (E) is delivered, and flows into the first passage space TS1 of the inlet passage portion 54A that is continuous with the inlet port 52 (refer to FIG. 5).

Figure 9:
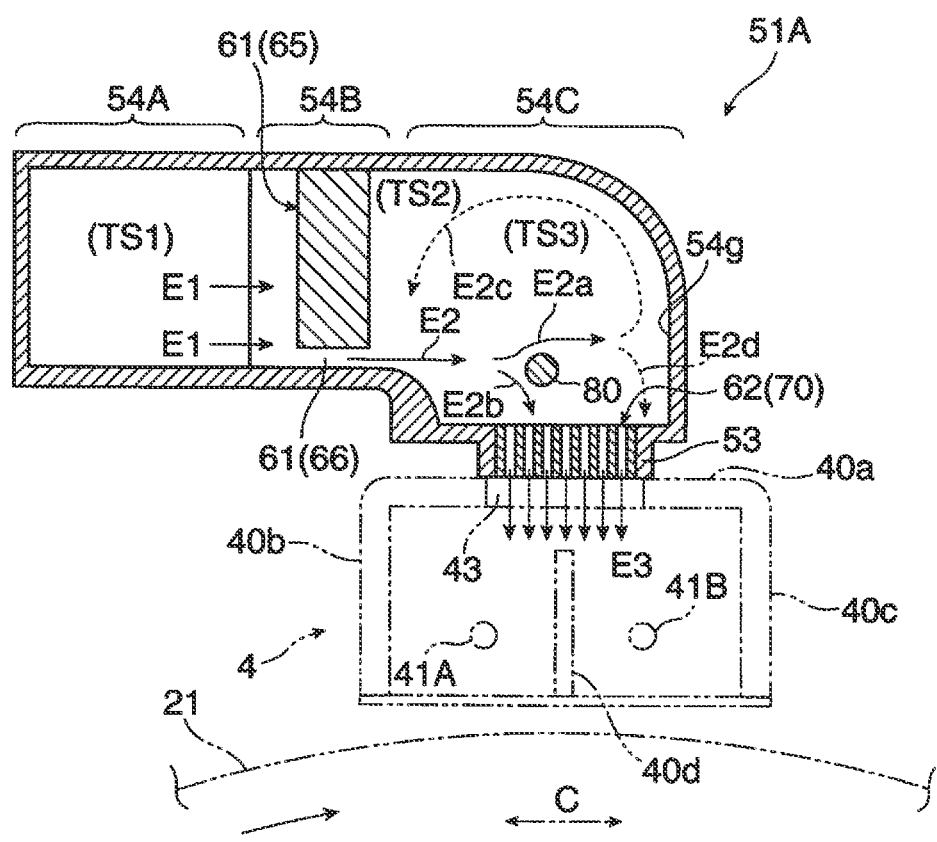
FIG. 9 is a view illustrating an operation state of the blowing device in FIG. 3.

Subsequently, as illustrated in FIG. 5 or 9, the air (E) taken into the blowing duct 51A is delivered and flows into the second passage space TS2 of the first bent passage portion 54B via the first passage space TS1 of the inlet passage portion 54A (refer to arrows E1a, E1b, E1c, and the like). Air (E1) delivered into the first bent passage portion 54B is blocked by the blocking portion 65 of the first restriction portion 61, and passes through the air passage portion 66 of the first restriction portion 61, and advances in a state where an advancing direction (airflow direction) of the air (E1) is changed at substantially the right angle.

Since the air (E2), which is air passing through the air passage portion 66 of the first restriction portion 61, passes through the air passage portion 66 having an opening (opening area) relatively smaller than the sectional area of the first passage space TS1 of the inlet passage portion 54A, a flow of the air (E2) is restricted (the pressure of the air (E2) increases). As a result, the air (E2) uniformly flows out from the air passage portion 66.

Subsequently, as illustrated in FIG. 9, at least a mainstream of the air (E2), which passes through the air passage portion 66 of the first restriction portion 61 and flows to the third passage space TS3 of the second bent passage portion 54C, collides against the bar-shaped member 80 which is provided in an isolated manner in the third passage space TS3 along the longitudinal direction (B) of the opening of the air passage portion 66 and diverges. Specifically, a portion (E2a) of the air becomes air (upper divergent air) diverging from the bar-shaped member 80 and flowing on the upper side, and the remainder (E2b) of the air becomes air (lower divergent air) diverging from the bar-shaped member 80 and flowing on the lower side.

At this time, the lower divergent air (E2b) advances toward the outlet port 53 lower than the bar-shaped member 80. As a result, the volume of air flowing through an end portion region (close to the air passage portion 66 of the first restriction portion 61 in the lateral direction C of the outlet port 53) in the third passage space TS3 of the second bent passage portion 54C increases more in comparison with that in a case where the bar-shaped member 80 is not disposed.

After the upper divergent air E2a advances over the bar-shaped member 80, the upper divergent air E2a collides with an inner wall surface 54g which is positioned away from the air passage portion 66 of the first restriction portion 61 in the third passage space TS3 of the second bent passage portion 54C. A portion (E2c) of the air advances in such a way as to diffuse while swirling in the third passage space TS3 that is wide and is positioned above the bar-shaped member 80. The remainder (E2d) of the air advances in such a way as to flow toward the outlet port 53 positioned on the lower side. The air (E2) flowing out through the air passage portion 66 of the first restriction portion 61 temporarily stays in the third passage space TS3 particularly due to the air (E2c) which advances in such a way as to diffuse while swirling in the third passage space TS3 of the second bent passage portion 54C. As a result, a variation in the air speed of the air (E2) is reduced.

As illustrated by an arrow E3 in FIG. 9, finally, the air (E2a and E2b), which diverges from the bar-shaped member 80 in the third passage space TS3 of the second bent passage portion 54C, passes through the multiple air passage portions (holes) 71 of the permeable member 70 forming the downstream-most restriction portion 62 that is provided in the outlet port 53 present at the end of the second bent passage portion 54C. As a result, the air is discharged in such a way as to be blown out from the outlet port 53.

At this time, since air (E3) blown out from the outlet port 53 passes through the multiple air passage portions 71 of the permeable member 70 which have an area relatively smaller than the third passage space TS3 of the second bent passage portion 54C and the opening area of the outlet port 53, a flow of the air (E3) is restricted (the pressure of the air (E3) increases). As a result, the air (E3) uniformly flows out from the outlet port 53.

As described above, since the air (E3) is discharged from the outlet port 53 of the blowing duct 51A while passing through the two restriction portions 61 and 62, the air (E3) is discharged in a state where the air speed is substantially uniform in the longitudinal direction B of the opening (elongated rectangular opening) of the outlet port 53. Since the air (E3) diverges from the bar-shaped member 80, and then is discharged from the outlet port 53 of the blowing duct 51A even in a case where the volume of air taken in by the inlet port 52 is increased, the air (E3) is discharged in a state where the air speed is also substantially uniform in the lateral direction C of the opening of the outlet port 53. The case where the volume of taken-in air is increased represents a case in which the air volume is increased from 0.27 m$^3$/min. to 0.33 m$^3$/min.

As illustrated in FIG. 9, after the air (E3), which is discharged from the outlet port 53 of the blowing duct 51A of the blowing device 5, blows and flows into the shielding case 40 via the opening portion 43 of the shielding case 40 of the charging device 4, the air (E3) blows to the corona discharge wires 41A and 41B that are respectively positioned in the spaces (S1 and S2) into which an internal space S of the shielding case 40 is divided by the partition wall 40d, and the air (E3) blows to the grid electrode 42 which is positioned in the lower opening portion of the shielding case 40.

Since the air (E3) blowing to the corona discharge wires 41A and 41B and the grid electrode 42 is discharged at a substantially uniform air speed in the longitudinal direction B and the lateral direction C of the opening of the outlet port 53 of the blowing duct 51A, the air (E3) substantially uniformly blows to the two corona discharge wires 41A and 41B and the grid electrode 42 in the longitudinal direction B, and substantially uniformly flows to the two corona discharge wires 41A and 41B.

Accordingly, it is possible to avoid the attachment of undesired substances such as paper dust, an external additive to the toner, and discharge products, to the two corona discharge wires 41A and 41B and the grid electrode 42 of the charging device 4 without variations by blowing more uniform air thereto.

As a result, it is possible to prevent the occurrence of degradation such as a variation in discharging performance (charging performance) of the charging device 4 which is caused by the sparsely attachment of undesired substances to the corona discharge wires 41A and 41B or the grid electrode 42, and it is possible to more uniformly (uniformly in the direction of the rotational axis of the photoconductor drum 21) charge the circumferential surface of the photoconductor drum 21 over a long period of time.

Test 1

Figure 10:
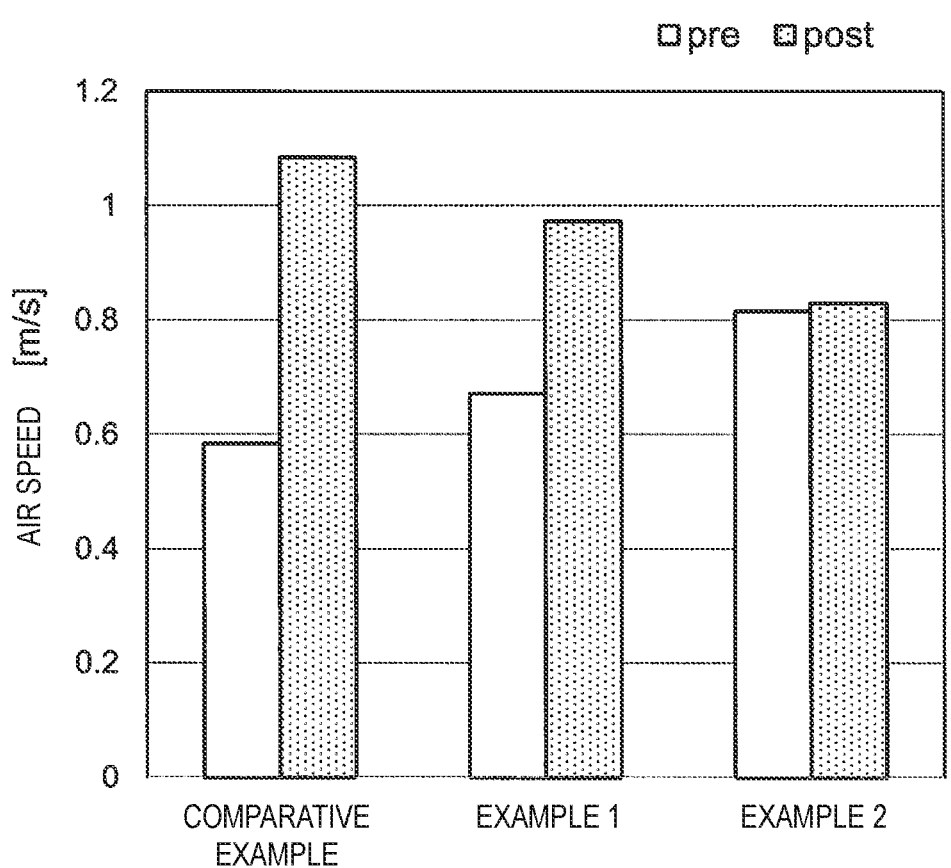
FIG. 10 is a graph illustrating results of Test 1.

FIG. 10 illustrates results of Test 1 performed to examine a performance characteristic (distribution of the air speed of air discharged from the blowing duct 51A in the lateral direction) of the blowing device 5.

In Test 1, when the air blower 50 introduces air into the inlet port 52 of the blowing duct 51A having the configuration at an average air volume of 0.33 m$^3$/min which is a relatively increased air volume, the air speed of the air, which is blown out from the outlet port 53 of the blowing duct 51A into the shielding case 40 of the charging device 4, is measured as follows via simulation.

Figure 11A:
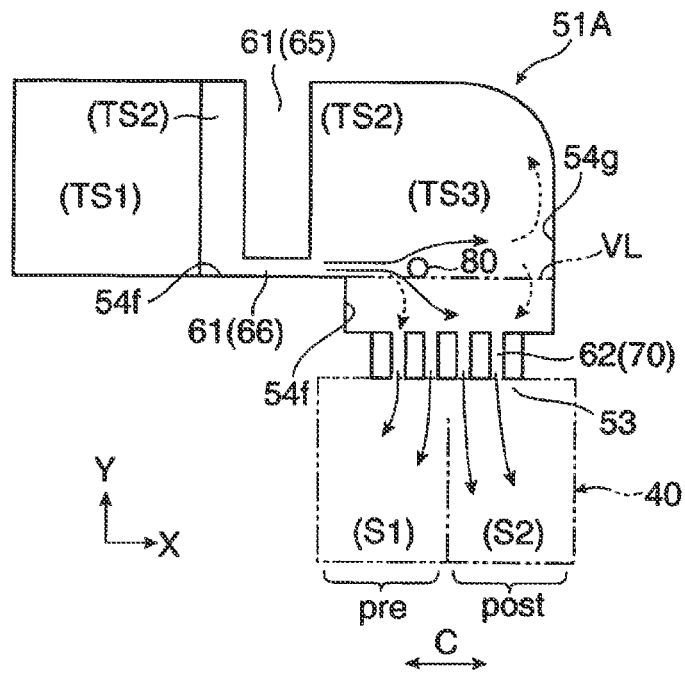
FIGS. 11A and 11B are views conceptually illustrating a configuration and an airflow state (the divergence of airflow by the bar-shaped member) of a blowing tube of an example used in Test 1.
Figure 11B:
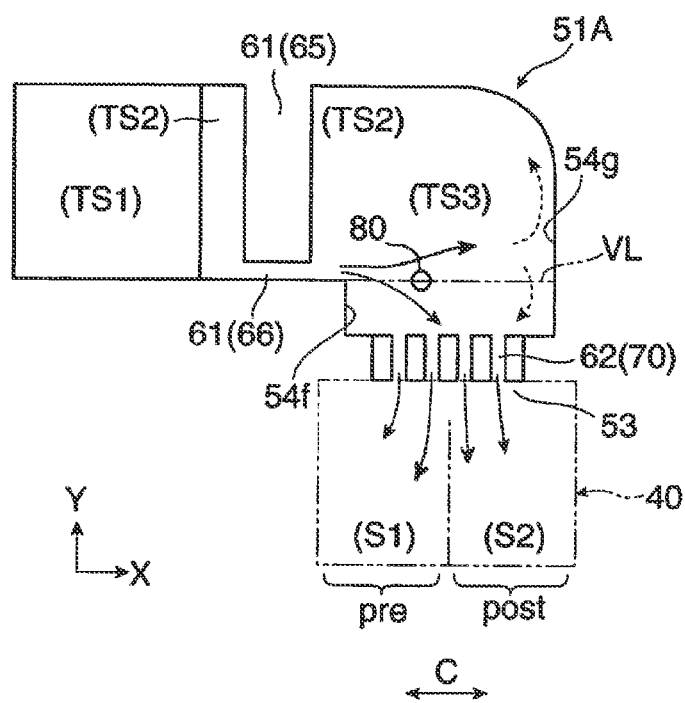

The air speed is measured, as illustrated in FIGS. 11A and 11B, and the like, in a divided space S1 (in other words, a front side area "pre" positioned on the upstream side of a rotational direction A of the photoconductor drum 21) which is positioned closer to the air passage portion 66 of the first restriction portion 61 than a center position of the outlet port 53 in the lateral direction C, and a divided space S2 (in other words, a rear side area "post" positioned on the downstream side of the rotational direction A of the photoconductor drum 21) which is positioned further away from the air passage portion 66 of the first restriction portion 61 than the center position in the lateral direction C. In this case, two measurement positions are set to the position of substantially the center of the outlet port 53 in the longitudinal direction B.

The blowing duct 51A includes the passage portion 54 having the entire shape illustrated in FIGS. 3 to 8. The inlet port 52 is configured as a substantially square (rectangular shape having a slightly long vertical length) opening having 23 mm×22 mm (vertical dimension x horizontal dimension), and the outlet port 53 is configured as an elongated rectangular opening having 350 mm×17.5 mm (dimension in the longitudinal direction B x dimension in the lateral direction C). The second passage space TS2 of the first bent passage portion 54B is configured as a passage space with a rectangular cross-section having a width W of 345 mm and a height H of 23 mm. The total volume of all of the passage spaces TS1 to TS3 of the blowing duct 51A is approximately 450 cm$^3$.

The first restriction portion 61 of the blowing duct 51A is provided such that the upstream surface portion 65a is present in a portion of the second passage space TS2 of the first bent passage portion 54B which is offset by a distance N of 6 mm from one side end portion 52a of the inlet port 52 (refer to FIG. 4).

The thickness (path length M of the air passage portion 66) of the blocking portion 65 of the first restriction portion 61 is set to 8 mm. In contrast, the air passage portion 66 of the first restriction portion 61 is configured as a rectangular opening having a height dl of 1.5 mm, a width W of 345 mm, and a path length M of 8 mm.

The second restriction portion 62 of the blowing duct 51A is configured as the permeable member 70 having a multi-hole structure in which the density of the air passage holes 71 (each having a hole diameter of 1 mm and a length of 3 mm) is set to 0.42 pieces/mm$^2$ (≈42 pieces/cm$^2$).

In the blowing ducts 51A of Examples 1 and 2, the bar-shaped (columnar) portions 80 having a sectional diameter of 2 mm are disposed at the following positions.

As illustrated in FIG. 11A, the bar-shaped member 80 of the blowing duct 51A of Example 1 is provided such that the position of the bar-shaped member 80 in a height direction of the blowing duct 51A is located on an extension line VL illustrated by an alternate one long and two short dashes line which extends from the bottom surface 54d of the first bent passage portion 54B (or the bottom surface of the air passage portion 66), and the position of the bar-shaped member 80 in the lateral direction C is located between a first point (black point illustrated in FIG. 11A) close to the air passage portion 66 and a second point (black point illustrated in FIG. 11A) next to the first point in a case where a separation distance (20 mm) between the inner wall surfaces 54f and 54g of the third passage space TS3 of the second bent passage portion 54C in the lateral direction C is divided into four equal sections.

As illustrated in FIG. 11B, the bar-shaped member 80 of the blowing duct 51A of Example 2 is provided such that the position of a lowermost portion of the bar-shaped member in the height direction of the blowing duct 51A is deviated 1 mm downward from the extension line VL, and the position of the bar-shaped member 80 in the lateral direction C is located at the same position as that in the bar-shaped member 80 of Example 1.

Figure 19:
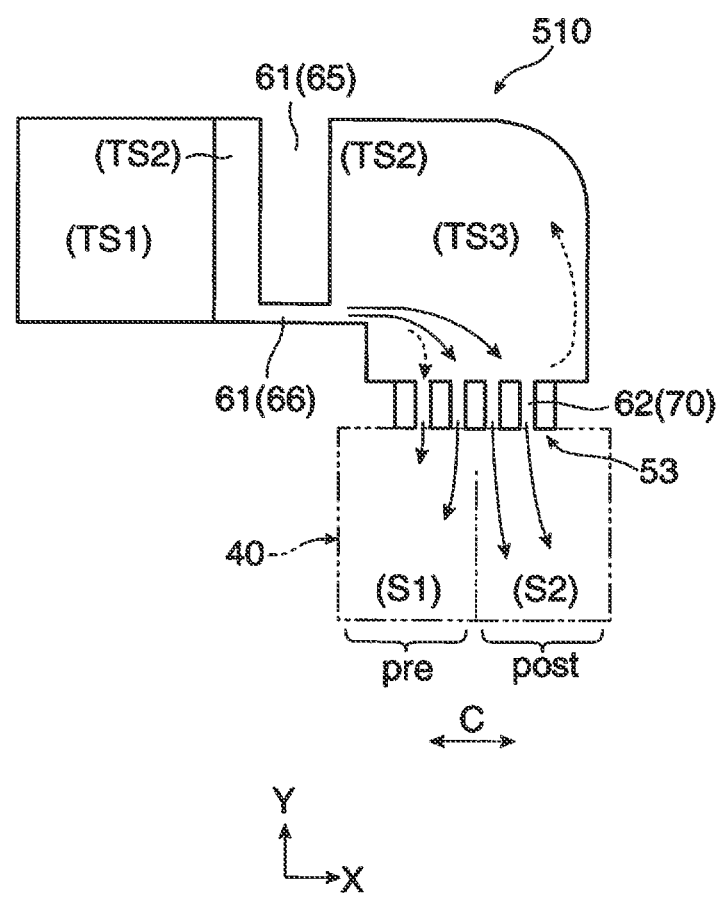
FIG. 19 is a view illustrating an outline of a blowing tube in a comparative example.

For the purpose of comparison, similarly, Test 1 is performed on a blowing duct (comparative example) 510 illustrated in FIG. 19.

The blowing duct 510 of the comparative example is different from the blowing ducts 51A of Examples 1 and 2 in that the bar-shaped member 80 is not provided in the blowing duct 510, and the rest of the configuration is the same as that of the blowing duct 51A.

A result of Test 1 performed on the comparative example is also illustrated in FIG. 10.

It is ascertained from the results illustrated in FIG. 10 that if an increase in the volume of air taken in by the inlet port 52 is relatively large, in the blowing duct 510 of the comparative example, the air speed of the rear side area "post" in the lateral direction C of the opening of the outlet port 53 becomes high, an air speed variation occurs.

In contrast, it is ascertained that in either of the blowing ducts 51A of Examples 1 and 2, even if an increase in the volume of air taken in by the inlet port 52 is relatively large, the air speed of the rear area "post" in the lateral direction C of the opening of the outlet port 53 is lower than that in the comparative example, an increase in the air speed of the front side area "pre" is larger than that in the comparative example, and as a result, an air speed variation in the lateral direction C is reduced. It is confirmed that particularly in the blowing duct 51A of Example 2, a ratio (pre/post ratio) of the air speed of the front side area "pre" to the air speed of the rear side area "post" is a value close to substantially 1.0, and an ideal result can be obtained.

It is confirmed that in any of the blowing duct 510 of the comparative example and the blowing ducts 51A of Examples 1 and 2, even if an increase in the volume of air taken in from the inlet port 52 is relatively large, an air speed variation in the longitudinal direction B of the opening of the outlet port 53 is reduced, and a good result is obtained.

Test 2

Figure 12:
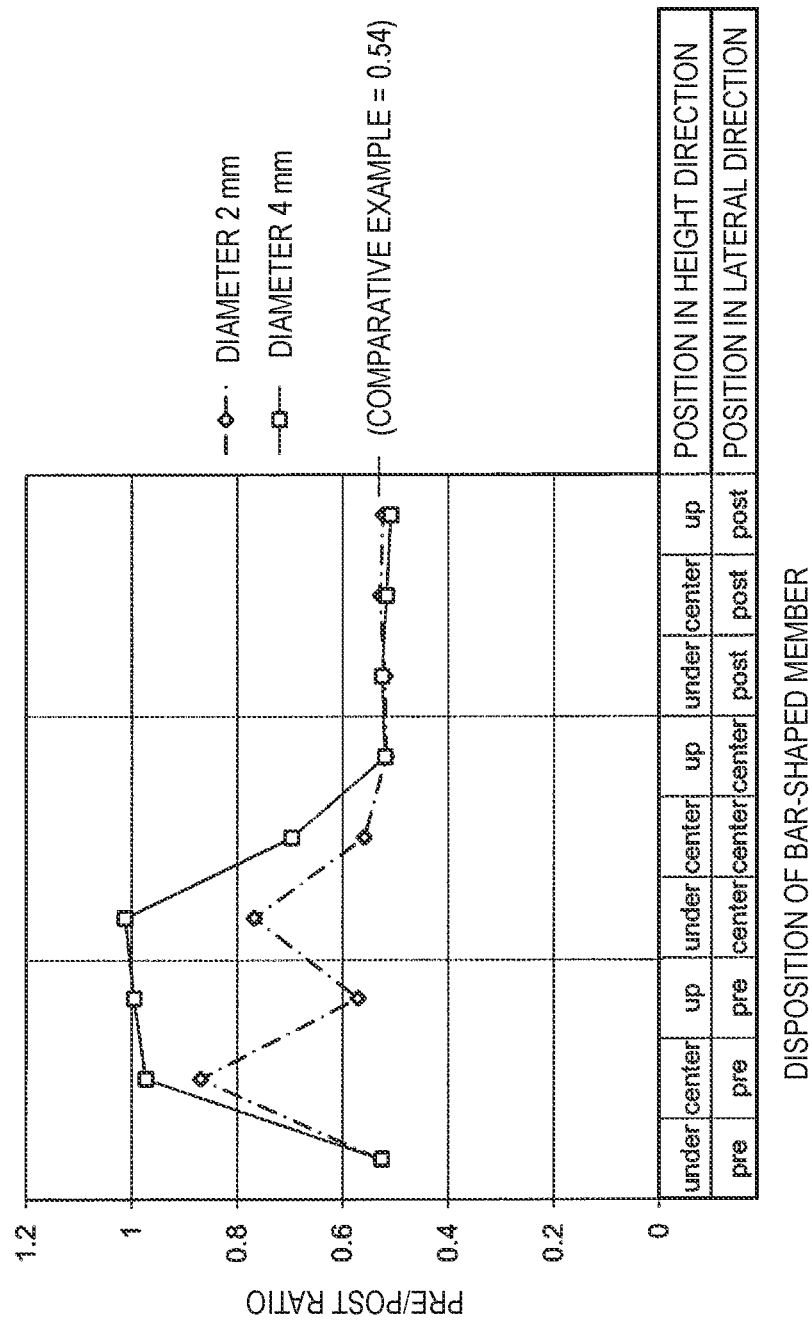
FIG. 12 is a graph illustrating results of Test 2.

FIG. 12 illustrates results of Test 2 performed to examine a performance characteristic (a relationship between the disposition position of the bar-shaped member 80 and a distribution of the air speed of air discharged from the blowing duct 51A in the lateral direction) of the blowing device 5.

Figure 13:
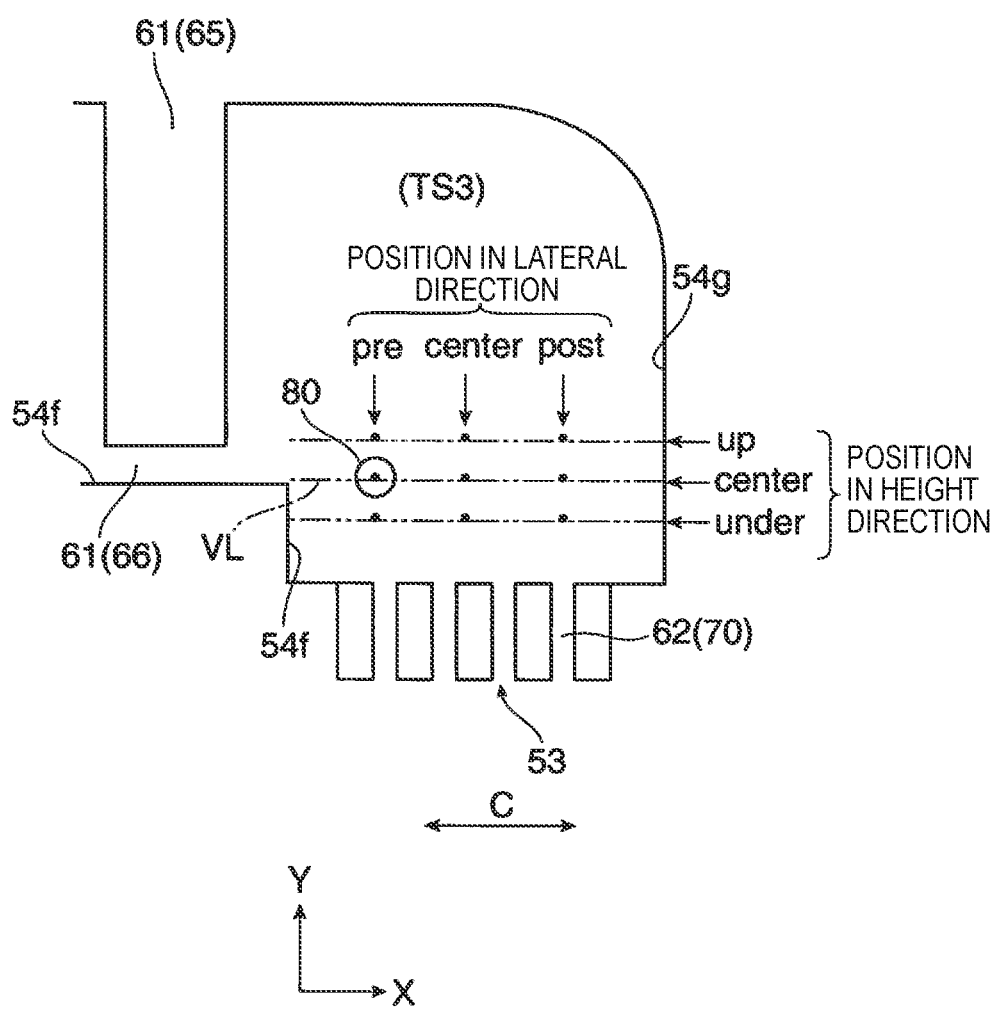
FIG. 13 is a view illustrating a disposition condition of the bar-shaped member in Test 2.

In Test 2, in a case where the blowing ducts 51A of Example 1 of Test 1 are used, the bar-shaped members 80 are disposed according to disposition conditions illustrated in FIGS. 12 and 13, and air is introduced into the inlet port 52 of each of the blowing ducts 51A at an average air volume of 0.33 m$^3$/min, similar to Test 1, the air speed of the air, which is blown out from the outlet port 53 of the blowing duct 51A into the shielding case 40 of the charging device 4, is measured via simulation.

As illustrated in FIG. 13, with regard to the height position, the position of the extension line VL extending from the bottom surface 54d (or the bottom surface of the air passage portion 66) of the first bent passage portion 54B already described in Test 1 is referred to as a "center" height, a position moved 2 mm upward from the extension line VL in a parallel manner is referred to as an "up" height, and a position moved 2 mm downward from the extension line VL in a parallel manner is referred to as a "under" height.

As illustrated in FIG. 13, with regard to a position in the lateral direction C, in a case where the separation distance (20 mm) between the inner wall surfaces 54f and 54g of the third passage space TS3 in the lateral direction C already described in Test 1 is divided into four equal sections, a center position is referred to as a "center" position, a position, which is closer to the air passage portion 66 (inner wall surface 54f) than the "center" position, is referred to as a "pre" position, and a position (position close to the inner wall surface 54g), which is spaced further away from the air passage portion 66 than the "center" position, is referred to as a "post" position. The "pre" position is spaced 5 mm away from the inner wall surface 54f, the "center" position is spaced 10 mm away from the inner wall surface 54f, and the "post" position is spaced 15 mm away from the inner wall surface 54f.

Two types of the bar-shaped members 80 having a circle shape in section and diameters of 2 mm and 4 mm are used. The bar-shaped members 80 having the diameters are provided according to the aforementioned disposition conditions. The bar-shaped members 80 are disposed such that the center of the circle thereof in section match a position for each disposition condition.

It is ascertained from the results illustrated in FIG. 12 that if the bar-shaped members 80 are installed at the "pre" position in the lateral direction C, regardless of a difference in diameters, the pre/post ratio has a relatively satisfactory value (0.6 or greater) at large, and an air speed variation in the lateral direction C is likely to be reduced. It is ascertained that in a case where the position of the bar-shaped member 80 in the lateral direction C is located at the "post" position, even if the bar-shaped member 80 is installed at any position in the height direction, the pre/post ratio does not have a satisfactory value, and the pre/post ratios have satisfactory values at the "pre" and "center" positions other than the "post" position.

Test 3

Figure 14:
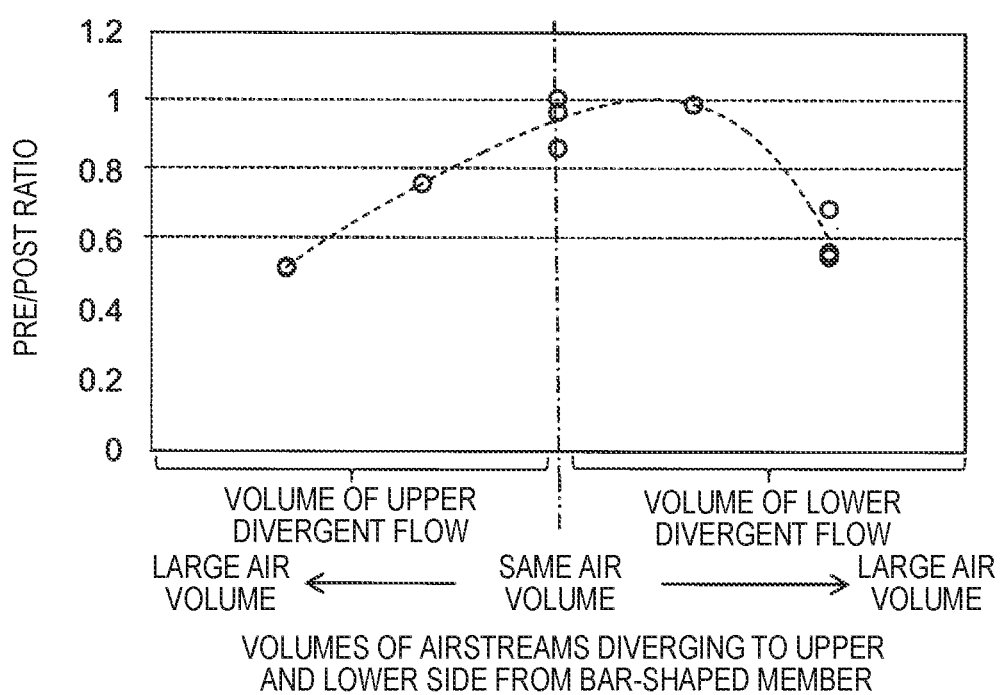
FIG. 14 is a graph illustrating results of Test 3.

FIG. 14 illustrates results of Test 3 performed to examine a performance characteristic (a relationship between the volume of a divergent airstream formed by the bar-shaped member 80 and a distribution of the air speed of air discharged from the blowing duct 51A in the lateral direction) of the blowing device 5.

In Test 3, in a case where the blowing ducts 51A of Test 2 are used, the bar-shaped members 80 having a diameter of 4 mm are disposed according to the same disposition conditions as those of Test 2 (illustrated in FIGS. 12 and 13), and air is introduced into the inlet port 52 of each of the blowing ducts 51A at an average air volume of 0.33 m³/min, similar to Test 1, the air speed of the air, which is blown out from the outlet port 53 of the blowing duct 51A into the shielding case 40 of the charging device 4, is measured via simulation, and the volume of an airstream diverging to the upper side of the bar-shaped member 80 and the volume of an airstream diverging to the lower side are measured. The volume of the divergent airstream formed by the bar-shaped member 80 is calculated from the air speed measured via simulation and the flow path area of a passage space.

It is ascertained from the results illustrated in FIG. 14 that if the volume of the upper divergent flow is substantially the same as that of the lower divergent flow, and if the volume of the lower divergent flow is slightly higher than that of the upper divergent flow, the pre/post ratio is likely to have a satisfactory or ideal value (0.8 or greater and approximately 1.0 or less).

Consideration

Figure 15:
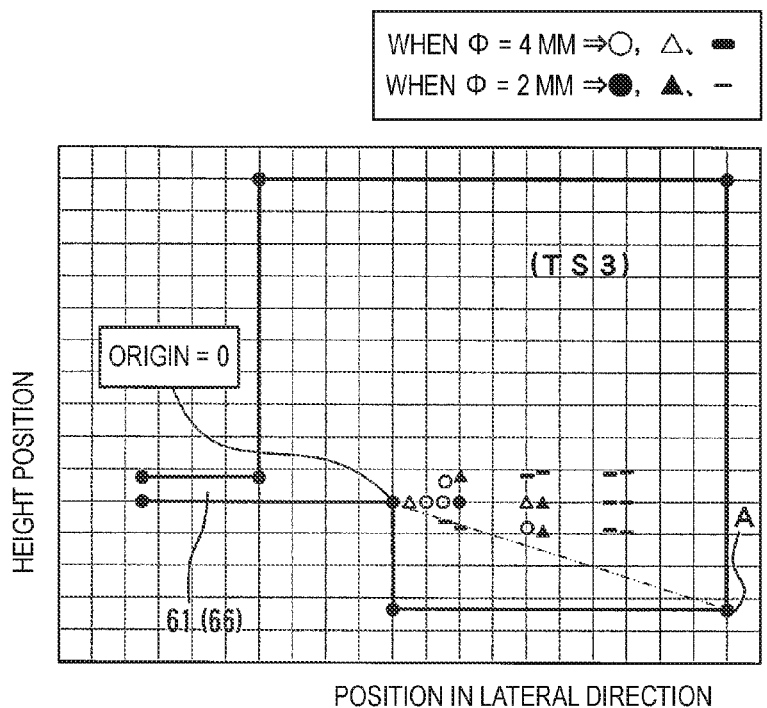
FIG. 15 is a view illustrating the consideration of the result of Test 2.

In FIG. 15, results of evaluating the pre/post ratios obtained in Test 2 are illustrated in a schematic view (portion illustrated by round points and straight lines) of the blowing duct 51A together with the position of the bar-shaped member 80.

In FIG. 15, the vertical and horizontal widths of a square (graticule) are 2 mm. The positions of the bar-shaped members 80 having a diameter (φ) of 2 mm are substantially exactly illustrated in the schematic view of the blowing duct 51A. In contrast, for illustrative purposes, the positions of the bar-shaped members 80 having a diameter (φ) of 4 mm are illustrated while being deviated toward the air passage portion 66 of the first restriction portion 61 from exact positions in the lateral direction. In FIG. 15 and the like, the "origin=0" represents the height position of the bottom surface 54d (or a lower surface of the air passage portion 66) of the second passage space TS2 of the first bent passage portion 54B. In FIG. 15, an "A" point represents a portion of a lower end portion of the third passage space TS3 of the second bent passage portion 54C, which is positioned away from the air passage portion 66.

The pre/post ratios are evaluated according to the following standards.

1.2>pre/post ratio>0.8: ○, ●
0.8>pre/post ratio>0.6: Δ, ▲
0.6≥pre/post ratio: -(thin line), -(bold line)

It can be ascertained from the results illustrated in FIG. 15 that in a case where the evaluation of the pre/post ratio shows a very good result (○ and ●) and a good result (Δ and ▲), the disposition positions of the bar-shaped member 80 are present in a specific area.

Figure 16:
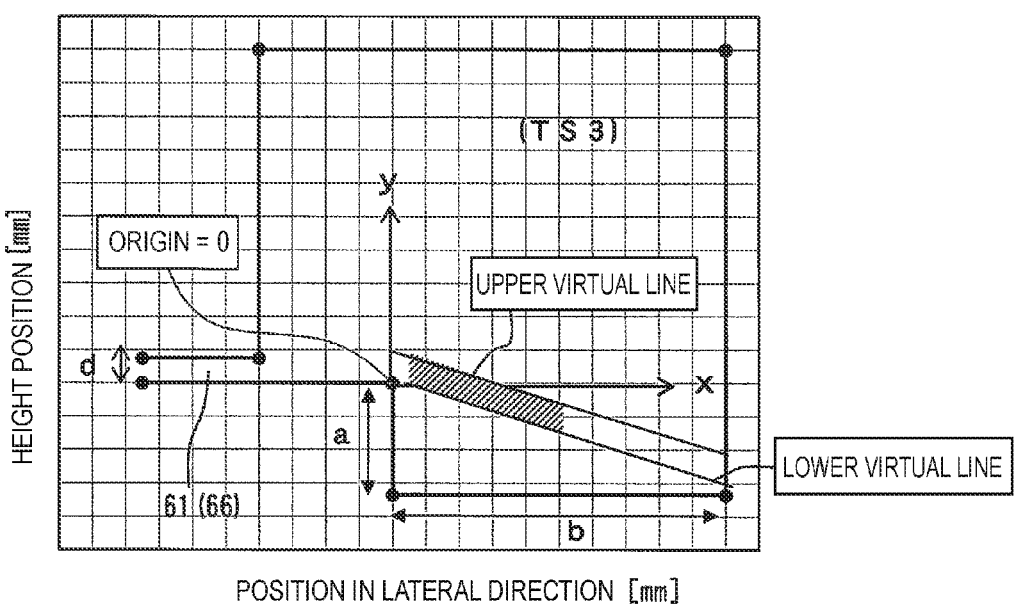
FIG. 16 is a graph illustrating a result of estimation regarding a disposition condition of the bar-shaped member based on the consideration in FIG. 15.

In FIG. 16, a presence area, in which a very good evaluation result and a good evaluation result of the pre/post ratios are present, is estimated based on the results illustrated in FIG. 15. In FIG. 16, a range bound by diagonal lines represents an area in which two types of good results can be obtained.

In FIG. 16, "a" represents a distance from the origin (=0) to an end portion of the third passage space TS3 of the second bent passage portion 54C in which the outlet port 53 is present, and "b" represents the length of the end portion of the third passage space TS3 in the lateral direction C in which the outlet port 53 is present.

According to the results illustrated in FIG. 15, it is estimated that the range of the presence area in the height direction is a range bound by a straight line (lower virtual line), which connects the origin (=0) (height position of the bottom surface 54d (or the lower surface of the air passage portion 66) of the second passage space TS2) to the A point of the lower end portion of the third passage space TS3 which is positioned away from the air passage portion 66, and a straight line (upper virtual line) moved d (the height of the air passage portion 66 of the first restriction portion 61) upward from the lower virtual line in a parallel manner.

In contrast, according to the results illustrated in FIG. 15, it is estimated that the range of the presence area in the lateral direction C is a range of "b/20≤x≤b/2". A lower value of "b/20" is a value deduced from a condition of "pre/post ratio>0.6", and an upper value of "b/2" corresponds to a "center" position in the lateral direction C. Particularly, the range in the lateral direction C is considered while taking into consideration a position at which the closet portion (reference sign 80b in FIG. 8) of the bar-shaped member 80, which is closest to the air passage portion 66 of the first restriction portion 61, is present.

It is considered from the aforementioned description that the presence area, in which a very good evaluation result and a good evaluation result of the pre/post ratios are present in FIG. 15, is the range bound by the lower virtual line ($y=(b/a)*x$), the upper virtual line ($y=(b/a)*x+d$), and "$b/20 \leq x \leq b/2$".

It can be said from a result of consideration that the installation position of the bar-shaped member 80 in the blowing duct 51A is preferably set as follows.

Figure 8:
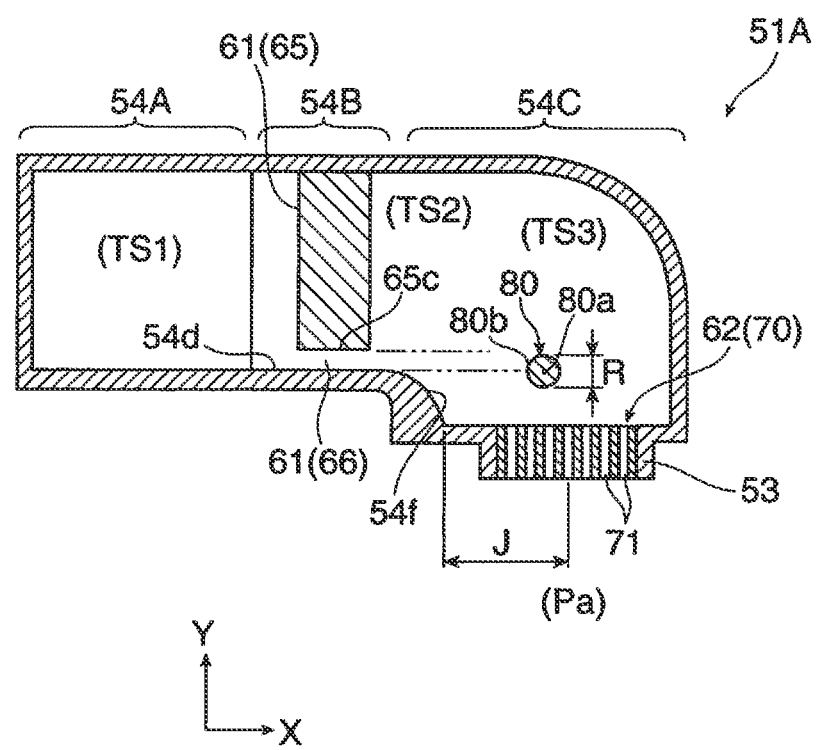
FIG. 8 is a sectional view illustrating the configuration of a bar-shaped member of the blowing device in FIG. 3.

That is, as illustrated in FIG. 8, the bar-shaped member 80 may be disposed such that at least a center 80a of the bar-shaped member 80 in section is present in the third passage space TS3 of the second bent passage portion 54C in a range J of from a center position Pa of the opening of the outlet port 53 in the lateral direction C perpendicular to the longitudinal direction B to the inner wall surface 54f which is located on the side where the air passage portion 66 of the first restriction portion 61 is present.

As illustrated in FIG. 8, from another viewpoint, the bar-shaped member 80 may be disposed such that the closest portion 80b, which is closest to the air passage portion 66 of the first restriction portion 61, is present in the range J.

The bar-shaped member 80 of Exemplary Embodiment 1 is required to be disposed at a position at which air flowing out through the air passage portion 66 of the first restriction portion 61 at least collides with the bar-shaped member 80. As illustrated in FIG. 8, the bar-shaped member 80 may be disposed such that the center 80a in section is present lower than (close to the outlet port 53) the height of an upper end (the lower end 65c of the blocking portion 65) of the air passage portion 66 of the first restriction portion 61.

Test 4

Figure 17:
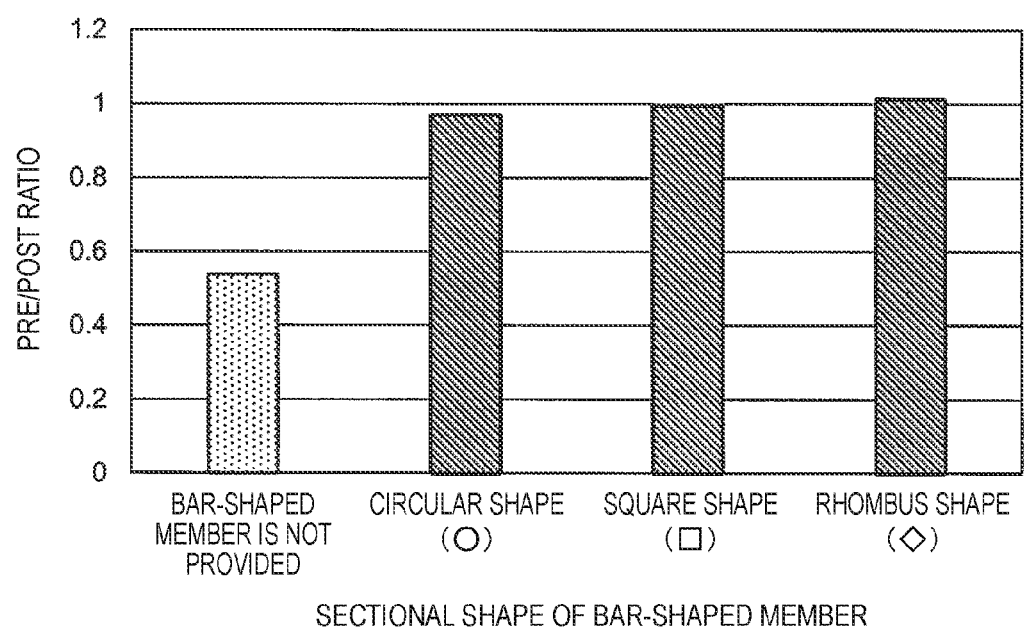
FIG. 17 is a graph illustrating results of Test 4.

FIG. 17 illustrates results of Test 4 performed to examine a performance characteristic (a relationship between the sectional shape of the bar-shaped member 80 and a distribution of the air speed of air discharged from the blowing duct 51A in the lateral direction) of the blowing device 5.

Figure 18A:
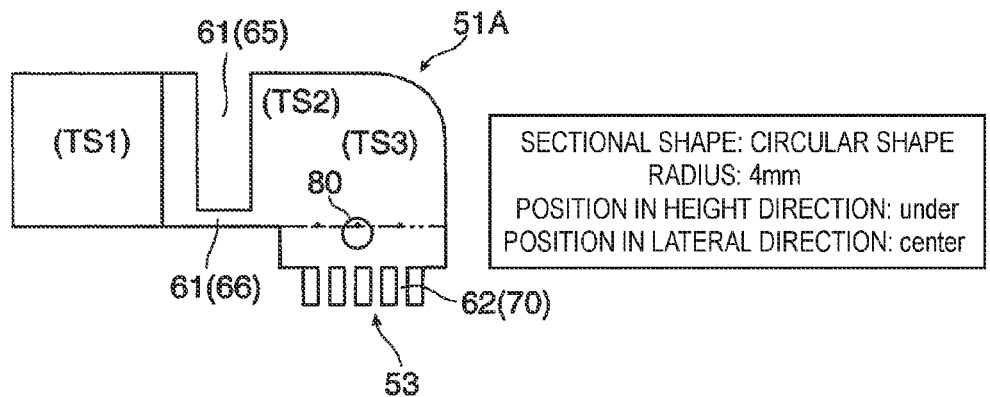
FIGS. 18A to 18C are views illustrating configurations of bar-shaped members of blowing tubes in Test 4.
Figure 18B:
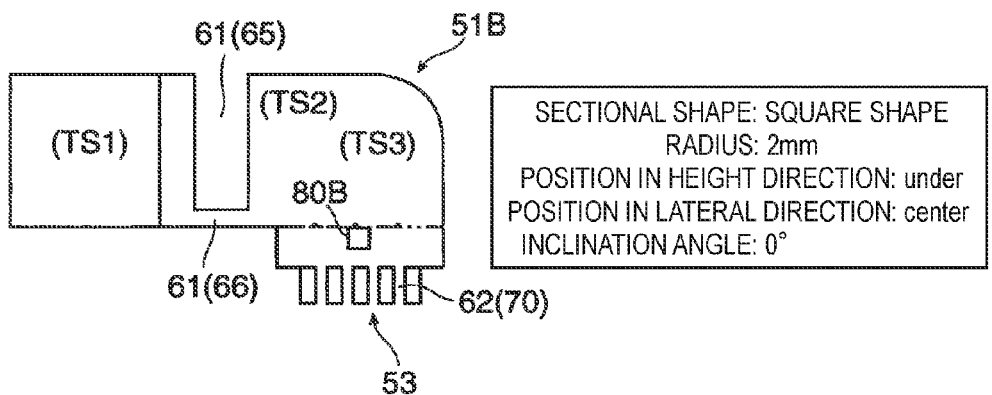
Figure 18C:
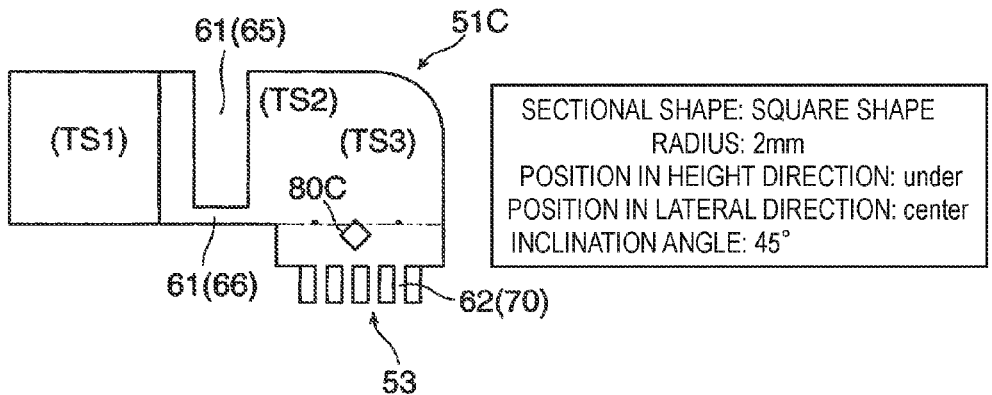

In Test 4, in a case where blowing ducts 51A, 51B, and 51C, which are obtained by disposing the bar-shaped members 80 having three different types of sectional shapes (illustrated in FIG. 18) in the blowing duct 51 of the examples of Test 1 according to disposition conditions illustrated in FIG. 18, are prepared, and air is introduced into the inlet port 52 of each of the blowing ducts 51A to 51C at an average air volume of 0.33 m³/min, similar to Test 1, the air speed of the air, which is blown out from the outlet port 53 of the blowing duct 51A into the shielding case 40 of the charging device 4, is measured via simulation, and at that time, the pre/post ratio is obtained. For the purpose of comparison, similarly, Test 4 is performed on the blowing duct 510 (refer to FIG. 19) of the comparative example in which the bar-shaped member 80 used in Test 1 is not installed.

It is ascertained from a result illustrated in FIG. 17 that a difference in the sectional shapes of the bar-shaped member 80 does not considerably affect the "pre/post" ratio indicating an air speed variation in the lateral direction C of the outlet port 53.

Other Exemplary Embodiments

In Exemplary Embodiment 1, the two restriction portions 61 and 62 are provided as multiple restriction portions in the blowing duct 51A of the blowing device 5. Alternatively, three or more restriction portions may be provided. Preferably, a restriction portion apart from the downstream-most restriction portion 62 provided in the outlet port 53 is provided in a portion of the passage space TS of the passage portion 54 of the blowing duct 51A, the sectional shape of which is changed, or is provided in a portion of the passage space TS which is positioned after (immediately after) the airflow direction is changed.

The downstream-most restriction portion 62 is not limited to the permeable member 70 illustrated in Exemplary Embodiment 1 and the like. The permeable member 70, which is represented by a porous member (member in which gaps between the multiple air passage portions 71 have irregular shapes) such as a non-woven fabric applied to a filter or the like, may be configured as the restriction portion 62 of another type. If it is possible to reduce an air speed variation in the longitudinal direction B of the outlet port 53 without the restriction portion 62 being disposed in the outlet port 53, the outlet port 53 may be formed to be completely open.

The charging device 4 to which the blowing device 5 is applied may be a charging device in which the grid electrode 42 is not installed, that is, a so-called corotron charging device. The charging device 4 may include one corona discharge wire 41, or may include three or more corona discharge wires 41. A target object for the blowing of air to which the blowing device 5 is applied may be configured as a corona discharger that eliminates a charge of the photoconductor drum 21 or the like, may be a corona discharger that charges or eliminates a charge of a to-be-charged body other than the photoconductor drum 21, or may be a long structure which is configured as a device other than a corona discharger and requires air blowing from the blowing device 5.

Insofar as a long target structure to which the blowing device 5 is required to be applied is installed in the image forming apparatus 1, a configuration regarding an image forming method or the like is not limited to a specific configuration. In the image forming apparatus 1 of Exemplary Embodiment 1, one image forming unit 20 is used to form a single color image. Alternatively, an image forming apparatus may be configured such that multiple image forming units 20 forming different color images are used to form multiple color images. If necessary, an image forming apparatus may adopt an image forming method by which an image formed of a material other than a developer is formed.

The foregoing description of the exemplary embodiments of the present invention has been provided for the purposes of illustration and description. It is not intended to be exhaustive or to limit the invention to the precise forms disclosed. Obviously, many modifications and variations will be apparent to practitioners skilled in the art. The embodiments were chosen and described in order to best explain the principles of the invention and its practical applications, thereby enabling others skilled in the art to understand the invention for various embodiments and with the various modifications as are suited to the particular use contemplated. It is intended that the scope of the invention be defined by the following claims and their equivalents.

What is claimed is:

1. A blowing tube comprising:
   a passage portion that includes a passage space that connects an inlet port taking in air and an outlet port through which the air taken in from the inlet port is discharged, the outlet port having an opening which is longer in one direction, the air flowing through the passage space; and a plurality of restriction portions that are provided at different portions of the passage space of the passage portion in an airflow direction and that restrict a flow of the air, wherein the passage portion includes
  an inlet passage portion including a first passage space having a shape in which the inlet port is present at one end thereof,
  a first bent passage portion including a second passage space having a shape that is bent at an intermediate portion of the inlet passage portion and extends, and
  a second bent passage portion including a third passage space having a shape that has a bent portion that is bent from an end of the first bent passage portion in one direction, the outlet port being disposed at an end of the second bent passage extending from the bent portion, wherein one of the restriction portions is a first restriction portion including a plate-shaped blocking portion and an air passage portion, the plate-shaped blocking portion being disposed across a portion of the second passage space of the first bent passage portion so as to block a flow of the air, the air passage portion being disposed between one end of the blocking portion and an inner wall surface that is disposed on an inner side of the second passage space of the first bent passage portion in a bent direction of the second bent passage portion, the air passage portion having a rectangular opening through which the air passes, wherein a bar-shaped member is provided in the third passage space of the second bent passage portion such that the bar-shaped member is present in an isolated manner along a longitudinal direction of an opening of the air passage portion of the first restriction portion, and the air flowing out through the air passage portion collides against the bar-shaped member and diverges, and wherein the bar-shaped member is disposed such that a center of the bar-shaped member in section is present in the third passage space of the second bent passage portion in a range of from a center position of the opening of the outlet port in a lateral direction perpendicular to a longitudinal direction of the outlet port to the inner wall surface that is located on a side where the air passage portion of the first restriction portion is present.

2. The blowing tube according to claim 1,
wherein the bar-shaped member is disposed such that a closest portion of the bar-shaped member to the air passage portion of the first restriction portion is present in the third passage space of the second bent passage portion in a range of from a center position of the opening of the outlet port in a lateral direction perpendicular to a longitudinal direction of the outlet port to the inner wall surface that is located on a side where the air passage portion of the first restriction portion is present.

3. A blowing device comprising:
an air blower that delivers air; and
a blowing tube according to claim 1 that takes in air delivered from the air blower.

4. An image forming apparatus comprising:
an image forming unit that forms an image; and
a blowing device that blows air to a target structure, wherein the blowing device is a blowing device according to claim 3.

5. The image forming apparatus according to claim 4,
wherein the target structure is a corona discharger which is longer in one direction.

6. The image forming apparatus according to claim 1,
wherein the bar-shaped member has a circle shape in section having a diameter which is equal to or greater than a height of the air passage portion of the first restriction portion, and which is equal to or less than a value three times the height of the air passage portion of the first restriction portion.

7. A blowing tube comprising:
a passage portion that includes a passage space that connects an inlet port taking in air and an outlet port through which the air taken in from the inlet port is discharged, the outlet port having an opening which is longer in one direction, the air flowing through the passage space; and
a plurality of restriction portions that are provided at different portions of the passage space of the passage portion in an airflow direction and that restrict a flow of the air, wherein the passage portion includes
  an inlet passage portion including a first passage space having a shape in which the inlet port is present at one end thereof,
  a first bent passage portion including a second passage space having a shape that is bent at an intermediate portion of the inlet passage portion and extends, and
  a second bent passage portion including a third passage space having a shape that has a bent portion that is bent from an end of the first bent passage portion in one direction, the outlet port being disposed at an end of the second bent passage extending from the bent portion, wherein one of the restriction portions is a first restriction portion including a plate-shaped blocking portion and an air passage portion, the plate-shaped blocking portion being disposed across a portion of the second passage space of the first bent passage portion so as to block a flow of the air, the air passage portion being disposed between one end of the blocking portion and an inner wall surface that is disposed on an inner side of the second passage space of the first bent passage portion in a bent direction of the second bent passage portion, the air passage portion having a rectangular opening through which the air passes, wherein a bar-shaped member is provided in the third passage space of the second bent passage portion such that the bar-shaped member is present in an isolated manner along a longitudinal direction of an opening of the air passage portion of the first restriction portion, and the air flowing out through the air passage portion collides against the bar-shaped member and diverges, and wherein the bar-shaped member is disposed such that a closest portion of the bar-shaped member to the air passage portion of the first restriction portion is present in the third passage space of the second bent passage portion in a range of from a center position of the opening of the outlet port in a lateral direction perpendicular to a longitudinal direction of the outlet port to the inner wall surface that is located on a side where the air passage portion of the first restriction portion is present.

8. The image forming apparatus according to claim 7,
wherein the bar-shaped member has a circle shape in section having a diameter which is equal to or greater than a height of the air passage portion of the first restriction portion, and which is equal to or less than a value three times the height of the air passage portion of the first restriction portion.

9. A blowing device comprising:

an air blower that delivers air; and a blowing tube according to claim 7 that takes in air delivered from the air blower.

10. An image forming apparatus comprising:

an image forming unit that forms an image; and a blowing device that blows air to a target structure, wherein the blowing device is a blowing device according to claim 9.

11. The image forming apparatus according to claim 10, wherein the target structure is a corona discharger which is longer in one direction.

* * * * *